United States Patent [19]

Shutou et al.

[11] Patent Number: 5,132,570

[45] Date of Patent: Jul. 21, 1992

[54] EXTENDED LOGICAL SCALE STRUCTURE OF A PROGRAMMABLE LOGIC ARRAY

[75] Inventors: Hideki Shutou; Fumihiro Suenaga, both of Kawasaki; Minoru Takeno, Yokohama, all of Japan

[73] Assignee: Fujitsu Limited, Kawasaki, Japan

[21] Appl. No.: 474,054

[22] PCT Filed: Aug. 30, 1989

[86] PCT No.: PCT/JP89/00890

§ 371 Date: Apr. 30, 1990

§ 102(e) Date: Apr. 30, 1990

[87] PCT Pub. No.: WO90/02450

PCT Pub. Date: Mar. 8, 1990

[30] Foreign Application Priority Data

Aug. 31, 1988 [JP] Japan .................. 63-215259
Aug. 31, 1988 [JP] Japan .................. 63-215260
Sep. 19, 1988 [JP] Japan .................. 63-232540

[51] Int. Cl.⁵ ............................... H03K 19/177
[52] U.S. Cl. .................... 307/465; 307/468
[58] Field of Search ............... 307/465–469, 307/272.2, 443; 364/716; 365/189.08; 371/22.2

[56] References Cited

U.S. PATENT DOCUMENTS

| | | | |
|---|---|---|---|
| 4,293,783 | 10/1981 | Patil | 307/465 |
| 4,461,000 | 7/1984 | Young | 371/22.2 |
| 4,524,430 | 6/1985 | Page | 365/189.08 |
| 4,719,599 | 1/1988 | Natsui et al. | 371/22.2 X |
| 4,780,628 | 10/1988 | Illman | 307/465 X |
| 4,791,603 | 12/1988 | Henry | 307/465 X |
| 4,796,229 | 1/1989 | Greer, Jr. et al. | 307/465 X |
| 4,831,573 | 5/1989 | Norman | 364/716 |

FOREIGN PATENT DOCUMENTS

| | | |
|---|---|---|
| 0055348 | 7/1982 | European Pat. Off. . |
| 0211960 | 4/1987 | European Pat. Off. . |
| 53-121537 | 10/1978 | Japan . |
| 57-206961 | 12/1982 | Japan . |

OTHER PUBLICATIONS

Curlander, "Logic Array Checking", *IBM T.D.B.*, vol. 18, No. 7, Dec. 1985, pp. 2044-2046.

Fujiwara et al., "A Design of Programmable Logic Arrays with Universal Tests", *IEEE T.O.C.*, vol. C-30, No. 11, Nov. 1981, pp. 823-824.

Pentzborn et al., "Array Initialization with Address Fault Checking", *IBM T.D.B.*, vol. 22, No. 2, Jul. 1979, pp. 737-738.

*Primary Examiner*—David Hudspeth
*Attorney, Agent, or Firm*—Staas & Halsey

[57] ABSTRACT

A programmable logic array with an extended logical scale includes a logic array part (21) which carries out a logic operation provided by a logic circuit for an input signal and provides an output signal indicative of an operation result. The logic array part includes semiconductor switching elements (22) provided at programmable logic array intersecting points, the logic operation of the logic circuit being changed by logic setting data supplied to the semiconductor switching elements. The structure further includes a storage circuit (23) which stores sets of logic setting data, and a setting circuit (24) which sequentially selects one of the sets of logic setting dated stored in the storage circuit and supplies the logic array part with the selected set of logic setting data.

29 Claims, 12 Drawing Sheets

EXTENDED LOGICAL SCALE STRUCTURE OF A PROGRAMMABLE LOGIC ARRAY

BACKGROUND OF THE INVENTION

1. Field of the Invention

The present invention relates to an extended logical scale structure of a programmable logical array, and more particularly to an extended logical scale structure of a programmable logic array which makes it possible to extend the scale of a logic circuit formed by a single logic array to a scale equivalent to the scale of a logic circuit formed by a plurality of logic arrays.

2. Description of the Related Art

A programmable logic array (hereinafter simply referred to as a PLA) is hardware for a logical calculation which can achieve a programmable logic circuit, and is a logic operation circuit which can present a desired logic circuit by a simple structure and which execute logic operation at high speeds.

FIG. 1 shows a basic structure of a PLA. For the sake of simplicity, FIG. 1 illustrates a PLA which achieves a logic operation circuit having two inputs ($x_1$, $x_2$) and two outputs ($y_1$, $y_2$). An input $x_1$ is supplied to an input buffer $11_1$. A positive logic output $x_1$ of the input buffer $11_1$ is output to an input line $1_1$, and a negative logic output $\overline{x_1}$ thereof is output to an input line $1_2$. Similarly, an input is supplied to an input buffer $11_2$. A positive logic output $x_2$ of the input buffer $11_2$ is output to an input line $1_3$, and a negative logic output $\overline{x_2}$ thereof is output to an input line $1_4$.

Resistors $12_1$ and $12_2$ each having an end connected to ground are connected to input terminals of output buffers $13_1$ and $13_2$ through output lines $O_1$ and $O_2$, respectively. Product term lines $a_1$ and $a_2$ extend in the direction perpendicular to the input lines $1_1$–$1_4$ and the output lines $O_1$ and $O_2$. The product term lines $a_1$ and $a_2$ are supplied with a high-level voltage Vcc through resistors $14_1$ and $14_2$, respectively.

Intersecting points where the input lines $1_1$–$1_4$ and the output lines $O_1$ and $O_2$ intersect with the product term lines $a_1$ and $a_2$ are called PLA intersecting points 15. A wiring group of the input lines $1_1$–$1_4$ and the product term lines $a_1$ and $a_2$ is called an AND array 16. A wiring group of the output lines $O_1$ and $O_2$ and the product term lines $a_1$ and $a_2$ is called an OR array 17.

The inputs $x_1$ and $x_2$ are drawn through the output buffers $13_1$ and $13_2$ as the outputs $y_1$ and $y_2$, which are represented by a logic formula of a desired sum-of-products style by making related groups of the PLA intersecting points 15 closed or open.

Now, a case is considered where hatched intersecting points among the PLA intersecting points 15 shown in FIG. 1 are made closed (short-circuits). In this case, the product term line $a_1$ is logic 1 when both the logic $x_1$ of the input line $1_1$ and the logic $\overline{x_2}$ of the input line $1_4$ are logic 1. The product term line $a_2$ is logic 1 when both the logic $\overline{x_1}$ of the input one $1_2$ and the logic $x_2$ of the input line $1_3$ are logic 1. When the output line $O_1$ is logic 1 when at least one of the product lines $a_1$ and $a_2$ is logic 1. When the output line $O_2$ is logic 1 when the product term line $a_1$ is logic 1. Therefore, the logical relationship between the outputs $y_1$, $y_2$ and the inputs $x_1$, $x_2$ are as follows:

$$y_1 = x_1 \cdot \overline{x_2} + \overline{x_1} \cdot x_2$$

$$y_2 = x_1 \cdot \overline{x_2}.$$

In a similar manner to the above-mentioned manner, a desired logic circuit can be formed by making a decision on whether each of the PLA intersecting points 15 should be made closed or open.

Conventionally, each of the PLA intersecting points 15 shown in FIG. 1 is formed by use of a fuse 18 shown in FIG. 2. In this case, all the fuses 18 corresponding the PLA intersecting points 15 are short-circuits at the stage of production. When a user uses PLA, a current pulse is applied to some of the fuses 18 selected based on the contents of a program achieved by a desired logic circuit. Thereby, the unnecessary fuses 18 at the PLA intersecting points 15 are made open so that desired configurations of the AND array 16 and the OR array 17 can be obtained. A PLA which has not been programmed at the manufacturing stage and which is programmed when used by users, is called a field programmable logic array (hereinafter simply referred to an FPLA).

However, in the above-mentioned fusing type FPLA, the fuses 18 must be fused by a specific fusing device in order to form a desired logic circuit. For this reason, programming is freely possible only before the user mounts the FPLA on a user's device. Further, the programmed contents cannot be modified after fusing.

In order to compensate the above-mentioned disadvantages, another PLA has been proposed in which the fuse 18 is replaced by a semiconductor switching element 19 shown in FIG. 3. The proposed PLA is an FPLA which provides a desired logic circuit by controlling the semiconductor switching element 19 through a control line 20 shown in FIG. 3 on the basis of ON/OFF information (hereinafter referred to as intersecting point information also) stored in a memory element. Such an FPLA is called an electrically alterable programmable logic array (hereinafter simply referred to as an EAPLA).

In such an EAPLA, it is possible to repeatedly program and modify the contents of logic since it does not utilize the structure that the fuse 18 is physically fused. In the EAPLA, pieces of intersecting point information equal to the number of the PLA intersecting points 15 forming the PLA are stored in the memory element. Each time logic of the PLA is changed, the storage contents of the memory element are changed. With the above-mentioned structure, a plurality of logic circuits can be achieved by a single EAPLA.

However, in the above-mentioned EAPLA, the scale of logic circuit is based on the number of semiconductor switching elements 19 equal to the number of the PLA intersecting points 15. For this reason, the degree of freedom to design logic circuits is low. Further, a structure of large size is required to achieve complex logic operation and a variety of logic operations.

In the case where a logic circuit is configured by use of PLA and the configured logic circuit is debugged by use of outputs of the logic circuit, it is required to use a large number of PLAs.

Moreover, in the case where the contents of the logic circuit are modified by changing intersecting point information on the semiconductor switching elements 19 of the PLA intersecting points, it is impossible to check whether a desired modification of logic has been provided in the logic circuit.

The present invention was made taking into account the above-mentioned matters, and is directed to providing an extended logical scale structure of a programmable logic array which makes it possible to extend the scale of a logic circuit formed by a single logic array to a scale equivalent to the scale of a logic circuit formed by a plurality of logic arrays.

SUMMARY OF THE INVENTION

The above object of the present invention is to be achieved by an extended logical scale structure of a programmable logic array, logic array means for carrying out a logic operation provided by a logic circuit for an input signal and for providing an output signal indicative of an operation result, the logic array means including semiconductor switching elements provided at programmable logic array intersecting points, the logic operation of the logic circuit being set by logic setting data supplied to the semiconductor switching elements, storage means for storing a plurality of sets of logic setting data, and setting means for selecting one of the sets of logic setting data stored in the storage means and supplying the logic array means with the selected set of logic setting data.

Since the logic array means performs changeable operation with a setting of logic by which is changeable by the setting means in accordance with the input signal, it becomes possible to selectively provide logic circuits which are equal in number to logic setting data stored in the storage means.

According to another aspect of the present invention, in addition to the logic array part and the storage means, there are provided selecting means for sequentially selecting one of the sets of logic setting data stored in the storage means and supplying the logic array means with the selected one of sets of logic setting data, latch means for temporarily storing the operation result supplied from the logic circuit of the logic array means and for outputting the latched operation result to the logic array means as the input signal for the logic array means and alternatively outputting the operation result as the output signal indicative of the operation result, and setting means provided with the latched operation result, for selecting one of the sets of logic setting data when the operation result is stored in the latch means. With the above-mentioned structure, it is possible to carry out time-series logic operation executed by the plurality of logic circuits for the input signal by use of a single PLA.

According to yet another aspect of the present invention, the logic array circuit is divided into a plurality of blocks, and the storage means is divided into the same number of memory areas. The extended logical scale structure further includes normality/defect detecting means for comparing the logic setting data read out from one of the plurality of memory areas and ON/-OFF information on the semiconductor switching elements obtained by supplying the read-out logic setting data to corresponding one of the blocks and for determining whether the structure operates correctly on the basis of the comparison result. With the above-mentioned structure, it is possible for a use to design the structure without a defective block. Additionally, it is possible to determine whether the logic setting data has an error.

Additional objects, features and advantages of the present invention will become apparent from the following detailed description when read in conjunction with the accompanying drawings.

DESCRIPTION OF THE PREFERRED EMBODIMENTS

Figure 4:
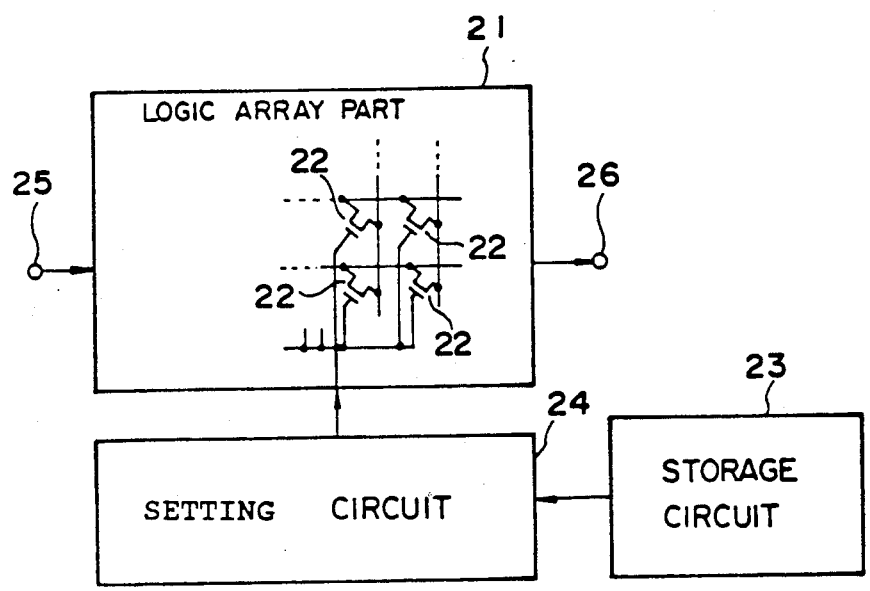
FIG. 4 is a block diagram illustrating the principle of the present invention.

Referring to FIG. 4, a single PLA is formed by a logic array part 21, a storage circuit 23 and a setting circuit 24. The logic array part 21 includes semiconductor switching elements 22 provided at PLA intersecting points. A logic circuit based on logic setting data is formed by executing switching control of the semiconductor switching elements 22 on the basis of the logic setting data.

The storage circuit 23 has been provided with a plurality of sets of logic setting data beforehand. The setting circuit 24 sequentially selects a set of logic setting data among the plurality of sets of logic setting data stored in the storage circuit 23, and outputs the selected logic setting data to the logic array part 21. Thereby, a corresponding one of the logic circuits is sequentially formed in the logic array part 21.

An input signal which is input to the logic array part 21 through an input terminal 25 is subjected to logic operation provided by the logic circuits, which are sequentially set one by one by the setting circuit 24. The results of the logic operation are sequentially output to an output terminal 26. Thus, the present invention makes it possible to select one of the plurality of logic circuits provided by the single logic array part 21. As a result, it becomes possible to extend the scale of the single logic array 21 to a logical scale equal to the logical scale provided by a plurality of logic array parts.

Figure 5:
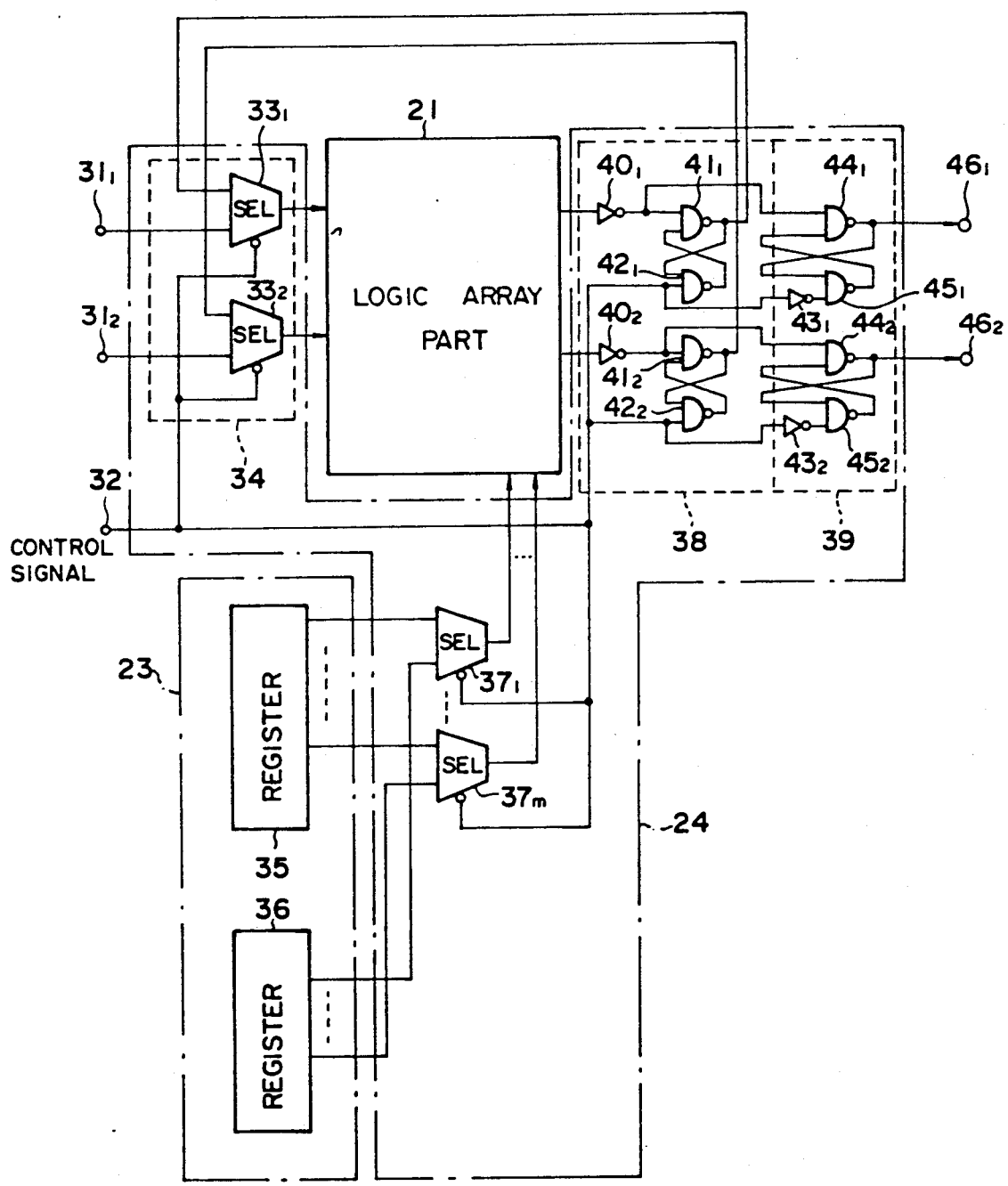
FIG. 5 is a block diagram of a first embodiment of the present invention.

A description is given of a first embodiment of the present invention with reference to FIG. 5. In FIG. 5, those parts which are the same as those shown in FIG. 4 are given the same reference numerals, and a description thereof is omitted. Referring to FIG. 5, an input signal composed of bits applied to input terminals $31_1$ and $31_2$ in parallel form is in phase with a control signal supplied to an input terminal 32. Selectors $33_1$ and $33_2$ are provided on the input side of the logic array part 21, and form an input selection circuit 34.

Registers 35 and 36 form the aforementioned storage circuit 23. The register 35 has been provided with first logic setting data which consists of m bits. The register 36 has been provided with second logic setting data which consists of m bits. Either the m-bit parallel logic setting data supplied from the register 35 or the m-bit parallel logic setting data supplied from the register 36 is selected by m selectors $37_1$–$37_m$, and then supplied to the logic array part 21. The supplied logic setting data executes ON/OFF switching control of the m semiconductor switching elements (not shown) provided at the PLA intersecting points in the logic array part 21. The logic array part 21 is set to a first logic circuit structure at the time of inputting the first logic setting data, and a second logic circuit structure at the time of inputting the second logic setting data.

Latch circuits 38 and 39 are provided on the output side of the logic array part 21. The latch circuit 38 latches the output signal composed of two bits supplied from the logic array part 21 in synchronism with the rise of the control signal through the input terminal 32, and feeds back the latched output signal to the input selection circuit 34. The latch circuit 38 is made up of inverters $40_1$, $40_2$, a first flip-flop circuit consisting of NAND circuits $41_1$ and $42_1$, and a second flip-flop circuit consisting of NAND circuits $41_2$ and $42_2$.

The latch circuit 39 latches the output signal composed of two bits supplied from the logic array part 21 in synchronism with the fall of the control signal through the input terminal 32, and outputs the latched output signal outside of the PLA through external terminals $46_1$ and $46_2$ in parallel form. The latch circuit 39 is made up of inverters $43_1$, $43_2$, a third flip-flop consisting of NAND circuits $44_1$ and $45_1$, and a fourth flip-flop consisting of NAND circuits $44_2$ and $45_2$.

The selectors $33_1$ and $33_2$ provided in the input selection circuit 34 selects one of the input signal supplied to the input terminals $31_1$ and $31_2$ and the output signal to be supplied the NAND circuits $41_1$ and $41_2$ provided in the latch circuit 38 on the basis of the level of the control signal.

Figure 6:
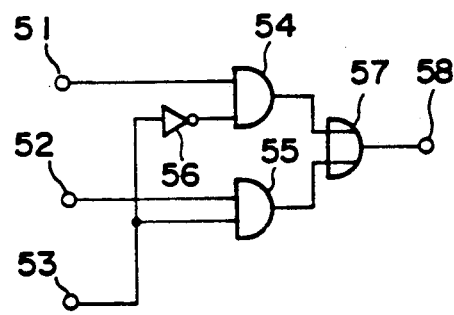
FIG. 6 is a circuit diagram of a selector shown in FIG. 5.

The selectors $33_1$, $33_2$, and $37_1$–$37_m$ are of the same structure as shown in FIG. 6, for example. Referring to FIG. 6, a first input terminal 51 and a second input terminal 52 are connected to input terminals of two-input AND circuits 54 and 55, respectively. A control signal input terminal 53 (corresponding to the aforementioned control signal input terminal 32) is connected to the other input terminal of the AND circuit 54 through an inverter 56, and directly connected to the other input terminal of the AND circuit 55. The output terminals of the AND circuits 54 and 55 are coupled to an output terminal 58 through a two-input OR circuit 57.

The selector shown in FIG. 6 outputs the second input signal applied to the input terminal 52 to the output terminal 58 when the control signal is at a high level. On the other hand, the selector outputs the first input signal applied to the input terminal 51 to the output terminal 58 when the control signal is at a low level.

In the first embodiment thus formed, the 2-bit input signal is supplied to the logic array 21 first, and is then processed by the first logic circuit formed by use of the first logic setting data stored in the register 35. Second, the 2-bit output signal supplied from the first logic circuit is supplied to the logic array part 21, and is then processed by the second logic circuit formed by use of the second logic setting data stored in the register 36. Then the output signal supplied from the second logic circuit is output outward through the latch circuit 39. Of course, the present invention is not limited to the two-bit inputs and the two-bit outputs. When an l-bit input signal is used, l selectors $33_1$, $33_2$, ..., $33_l$ are used, and each of the latch circuits 38 and 39 includes l flip-flops.

The operations of the input selection circuit 34, the registers 35, 36 and the latch circuits 38 and 39 are controlled by the same control signal (a clock signal) derived from a timing control circuit (not shown). Thus, the PLA of the first embodiment is of the synchronous type.

Figure 7:
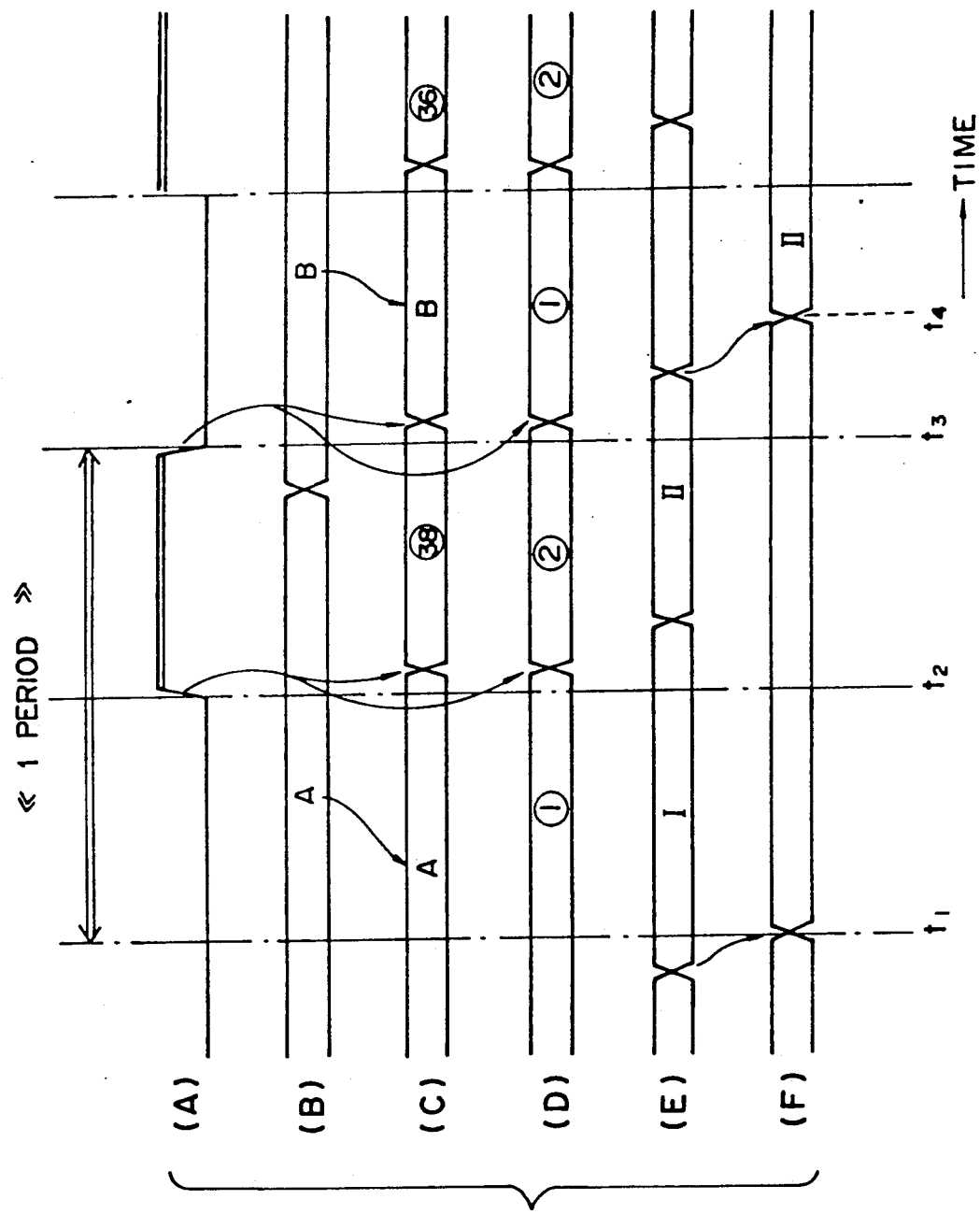
FIGS. 7A, B, C, D, E, and F are timing charts illustrating an operation of the first embodiment shown in FIG. 5.

A further description is given of the operation of the first embodiment with reference to FIGS. 5 through 7. FIG. 7(A) shows a waveform of the control signal supplied to the input terminal 32. The illustrated control signal is at a low level (L level) during the time between times $t_1$ and $t_2$, and is at a high level (H level) during the time between times $t_2$ and $t_3$. One period is formed between times $t_1$ and $t_3$. FIG. 7(B) shows a waveform of the input signal supplied to the input terminals $31_1$ and $31_2$ in parallel form. The content of the input signal is changed from A to B just prior to time $t_3$.

During the time when the control signal is at L level ($t_1$–$t_2$), as shown in FIG. 7(C), the input signal A is drawn through the selectors $33_1$ and $33_2$ and supplied to the logic array part 21. During this operation, the first logic setting data indicated by a reference ① shown in FIG. 7(D) is drawn from the register 35 through the selectors $37_1$ through $37_m$, and is input to the logic array part 21 so that the logic array part 21 is set to the first logic circuit.

Thereby, the input signal A is subjected to the logic operation by the first logic circuit formed in the logic array part 21. The output signal supplied from the logic array part 21 (the result of the first logic operation) is indicated as I shown in FIG. 7(E).

The output signal I of the logic array part 21 is latched by the latch circuit 38 when the control signal is switched to H level at time $t_2$ as shown in FIG. 7(A). That is, when the control signal is switched from L level to H level, the output signal bit supplied from the first output line through the inverter $40_1$ is latched by the NAND circuits $41_1$ and $42_1$, and the output signal bit supplied from the second output line through the inverter $40_2$ is latched by the NAND circuits $41_2$ and $42_2$. At this time, the same control signals to be supplied to the NAND circuits $45_1$ and $45_2$ are inverted through the inverters $43_1$ and $43_2$, respectively, so that they switch from H level to L level and thus the NAND circuits $44_1$, $45_2$, $44_2$ and $45_2$ are made inactive.

When the control signal changes from L level to H level, the second logic setting data stored in the register 36, as indicated by a reference ② shown in FIG. 7(D) is drawn through the selectors $37_1$–$37_m$. Simultaneously, the output signal supplied from the latch circuit 38 (the result of the second logic operation) indicated by a reference ㊳ shown in FIG. 7(C) is selected by the selectors $33_1$ and $33_2$. Thus, the logic array part 21 outputs a signal as indicated by II shown in FIG. 7(E), which is obtained by applying the logic operation provided by the second logic circuit by use of the second logic setting data to the result of the first logic operation.

Next, when the control signal changes from H level to L level at time $t_3$ as shown in FIG. 7(A), the same control signals to be supplied to the NAND circuits $45_1$ and $45_2$ are switched from L level to H level through the inverters $43_1$ and $43_2$, respectively. Thus, the output signal bit supplied from the first output line is latched by the NAND circuits $44_1$ and $45_1$ at time $t_4$ which slightly lags behind time $t_3$ and is output outward. At the same time, the output signal bit supplied from the second output line is latched by the NAND circuits $44_2$ and $45_2$ and is output outward.

Thus, the output signal supplied to the output terminals $46_1$ and $46_2$ from the latch circuit 39 is switched at time $t_4$ as indicated by II shown in FIG. 7(F). The output signal II shown in FIG. 7(F) is the same as the output signal supplied from the logic array part 21 indicated by reference II shown in FIG. 7(E), and is a signal obtained by passing the input signal through the first logic circuit and the second logic circuit in this order.

According to the first embodiment, it is possible to configure the first and second logic circuits formed by use of two sets of logic setting data registered in the registers 35 and 36 within one period of the control signal (clock signal). It follows that the first embodiment has the logic scale twice the logic scale of the logic array part 21.

The above description relates to the case where the logic scale of the logic array part 21 is extended double. It is also possible to triple the logic scale or more by using three registers or more provided in the storage circuit 24.

Figure 1:
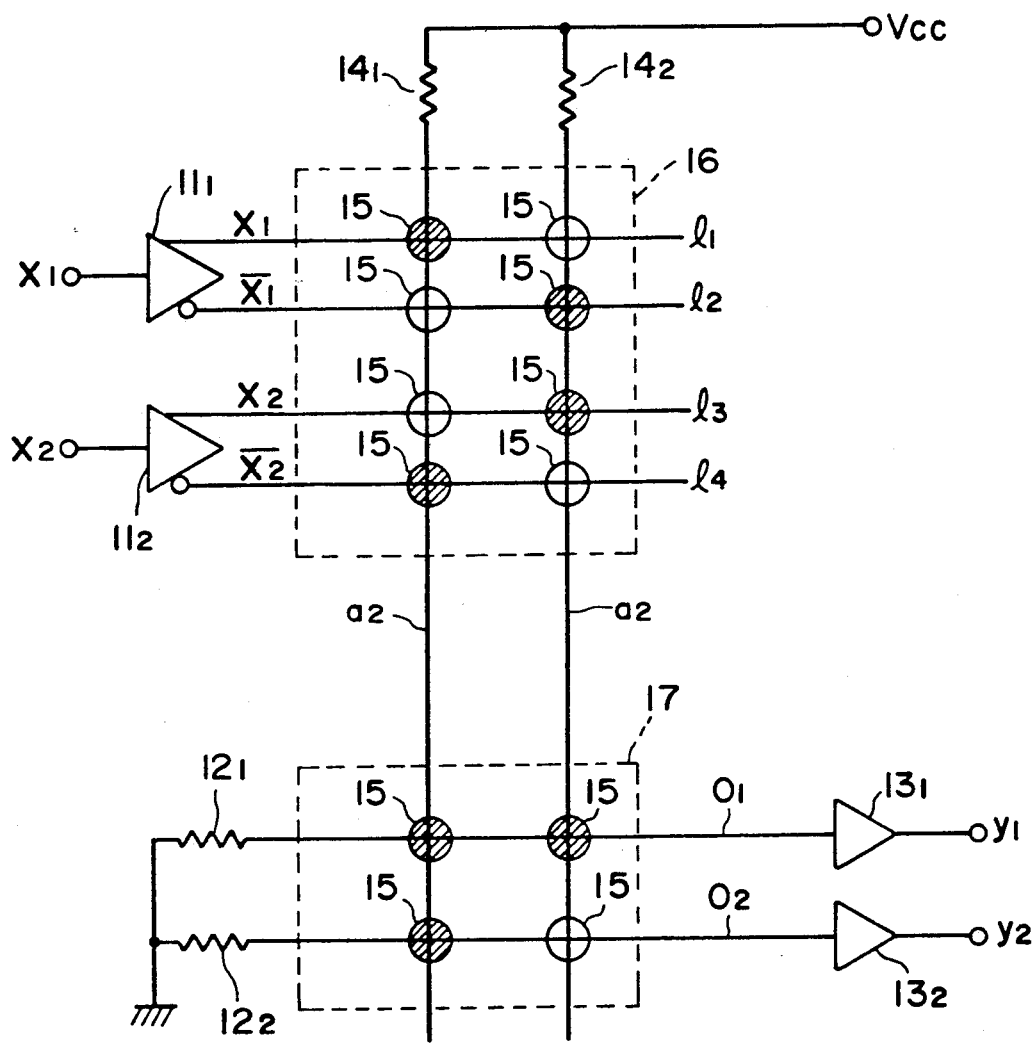
FIG. 1 is a circuit diagram illustrating a basic structure of a PLA.
Figure 2:
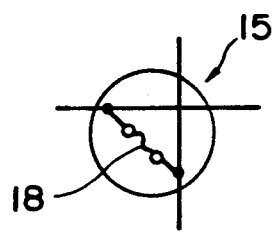
FIG. 2 is a circuit diagram of a fuse provided at a PLA intersecting point.
Figure 3:
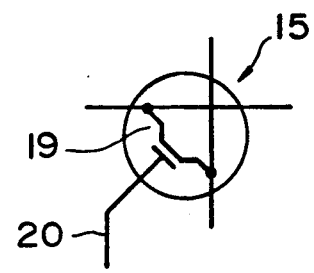
FIG. 3 is a circuit diagram of a semiconductor switching element provided at a PLA intersecting point.
Figure 8:
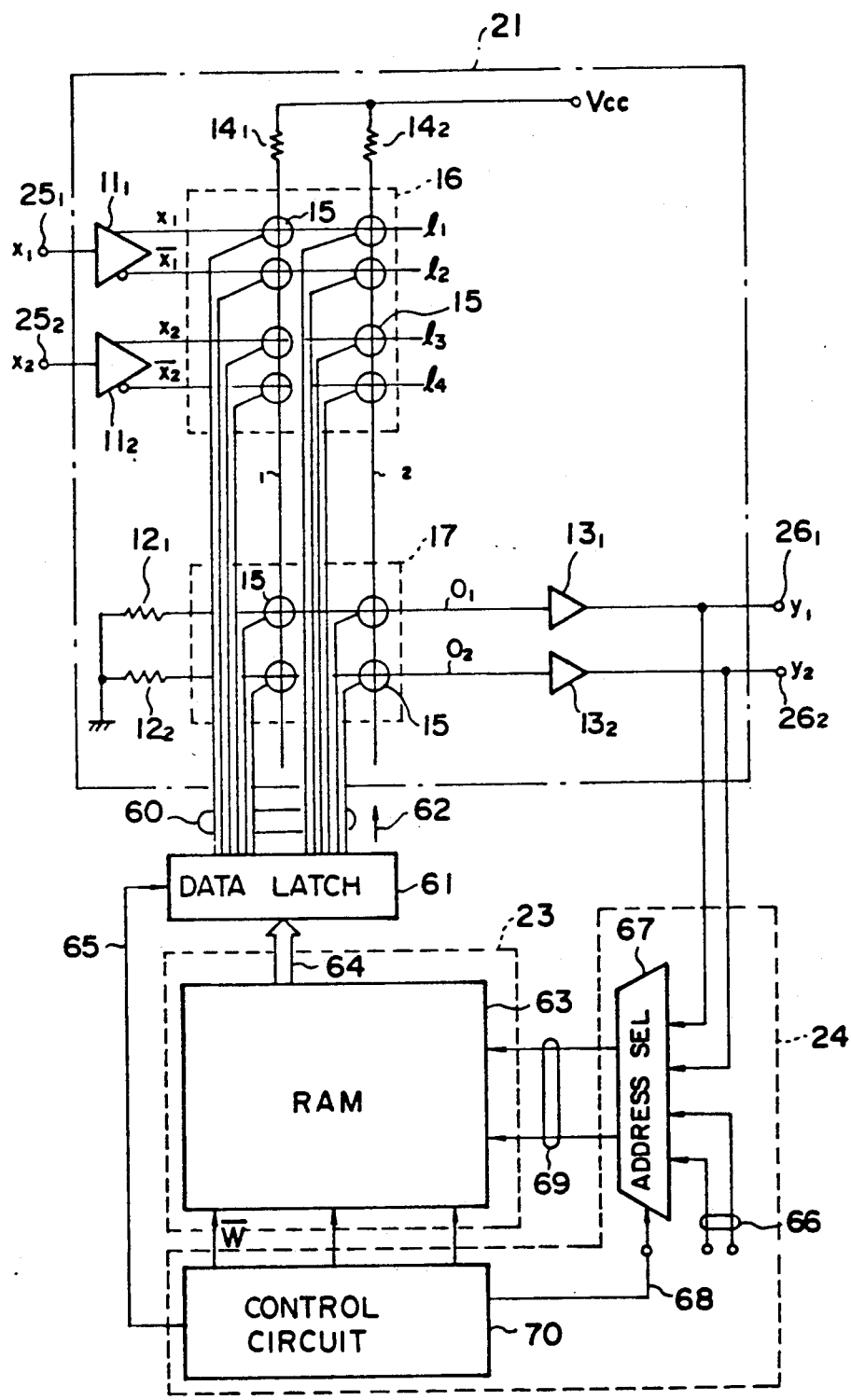
FIG. 8 is a block diagram of a second embodiment of the present invention.

A description is given of a second embodiment of the present invention with reference to FIG. 8. In FIG. 8, those parts which are the same as those shown in FIGS. 1 and 4 are given the same reference numbers, and a description thereof is omitted. Referring to FIG. 8, the control terminals of the semiconductor switching elements provided at the PLA intersecting points 15 are connected to output terminals of a data latch circuit 61 through control lines 60.

The data latch circuit 61 latches logic setting data 62 related to all the PLA intersecting points 15 of the logic array part 21, and outputs the same to the corresponding PLA intersecting points 15 through the control lines 60. The logic setting data 62 is defined by read-out data 64 which is supplied from a random access memory (hereinafter simply referred to as a RAM) 63 and is latched in the data latch circuit 61 in synchronism with a latch clock 65 derived from a control circuit 70.

The RAM 63 stores beforehand logic setting data 62 (read-out data 64) related to all the PLA intersecting points 15 in the logic array 21 for every available logic circuit. The logic array part 21 can provide a plurality of logic circuits.

Either the output signal consisting of $y_1$ and $y_2$ or an address signal consisting of two bits is selected through an address selector 67 controlled by a select signal 68 supplied from the control circuit 70, and is then supplied, as a memory address signal 69, to the RAM 63. The RAM 63 outputs, as read-out data 64, corresponding one of the sets of logic setting data on the basis of the supplied memory address signal 69. The above-mentioned operation can be executed during the time when a write enable signal $\overline{W}$ supplied from the control circuit 70 is made active.

In the configuration shown in FIG. 8, four logical states are available based on the 2-bit outputs $y_1$ and $y_2$. Thus, logic setting data 62 related to four logical states 1-4 are stored in the RAM 63 beforehand.

FIG. 10(A) shows a storage format of the logic setting data 62 related to four logical states. An area 91 labeled "STATE 1" stores the logic setting data 62 to be output as read-out data 64 when the outputs $y_1$ and $y_2$ are (0, 0). An area 92 labeled "STATE 2" stores the logic setting data 62 to be output as read out data 64 when the outputs $y_1$ and $y_2$ are (0, 1). An area 93 labeled "STATE 3" stores the logic setting data 62 to be output as read-out data 64 when the outputs $y_1$ and $y_2$ are (1, 0). An area 94 labeled "STATE 4" stores the logic setting data 62 to be output as read out data 64 when the outputs $y_1$ and $y_2$ are (1, 1).

A description is given of an operation of the second embodiment. Before starting operation, the address selector 67 selects the two-bit initial setting address 66 by the select signal 68 supplied from the control circuit 70, and outputs, as the memory address signal 69, the same to the RAM 63, so that the RAM 63 is accessed. At the same time, the write enable signal $\overline{W}$ is supplied to the RAM 63 from the control circuit 70 so that the RAM 63 is set to the output enable state.

Thereby, the logic setting data 62 corresponding to one of the four states 1-4 shown in FIG. 10(A) is output as the read-out data 64, which is latched in synchronism with the latch clock 65 supplied from the control circuit 70. Then the logic setting data 62 controls the states of the PLA intersecting points 15 provided in the logic array part 21 through the control lines 60. Thus, the logical state formed by the logic array part 21 is defined.

In this state, when the inputs $x_1$ and $x_2$ are supplied to the logic array part 21 after the write enable signal $\overline{W}$ returns to the inactive state, the corresponding logic operation is executed in the logic array part 21, which then determines the outputs $y_1$ and $y_2$.

On the other hand, after the aforementioned initial setting address 66 is selected through the address selector 67, the select signal 68 controls the address selector 67 so as to select the outputs $y_1$ and $y_2$. Thus, when the outputs $y_1$ and $y_2$ are determined, the RAM 63 is accessed by the memory address signal 69 which is formed by the determined output signals $y_1$ and $y_2$.

When the write enable signal $\overline{W}$ sets the RAM 63 to the output enable state with an appropriate timing, the state corresponding to the logical state defined by the outputs $y_1$ and $y_2$ is selected from among the states 1-4 shown in FIG. 10(A), and is then latched, as the read-out data 64, by the data latch circuit 61. Then each of the PLA intersecting points 15 of the logic array part 21 is set to the state indicated by the corresponding read-out data 64.

In the above-mentioned manner, the logic of the logic circuit formed by the logic array part 21 is dynamically changed based on a change of the logic state of the outputs $y_1$ and $y_2$. That is, an operation such that the logical state of the logic circuit is transitional by its own output state can be achieved. Therefore, since a decision on which one of the states 1-4 is selected is made by its own outputs $y_1$ and $y_2$, there is no need for a specific state transition control circuit for use in state selection. As a result, it is possible to achieve high-level logical state control for the logic array part 21 only by adding the control circuit 70 which generates the select signal 68, the latch clock signal 65 and the write enable signal $\overline{W}$.

According to the second embodiment, the kind of the logic operation to be next executed can be designated by the logic state of the outputs $y_1$ and $y_2$. As a result, with the logical scale of a single PLA, it is possible to achieve the logical scale which is attained by a large number of PLAs necessary for many kinds of logic operation.

Figure 9:
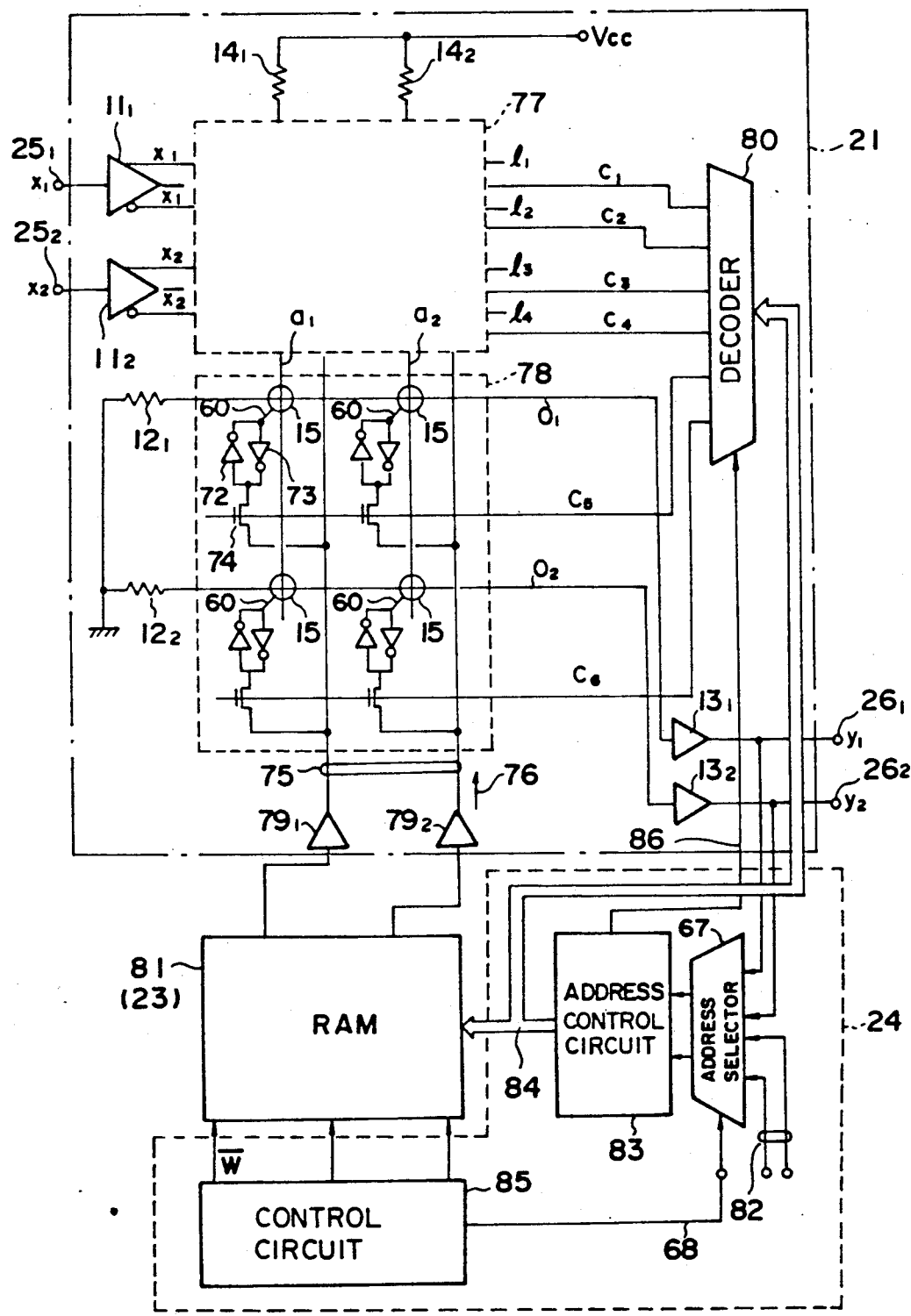
FIG. 9 is a block diagram of a third embodiment of the present invention.
Figure 10:
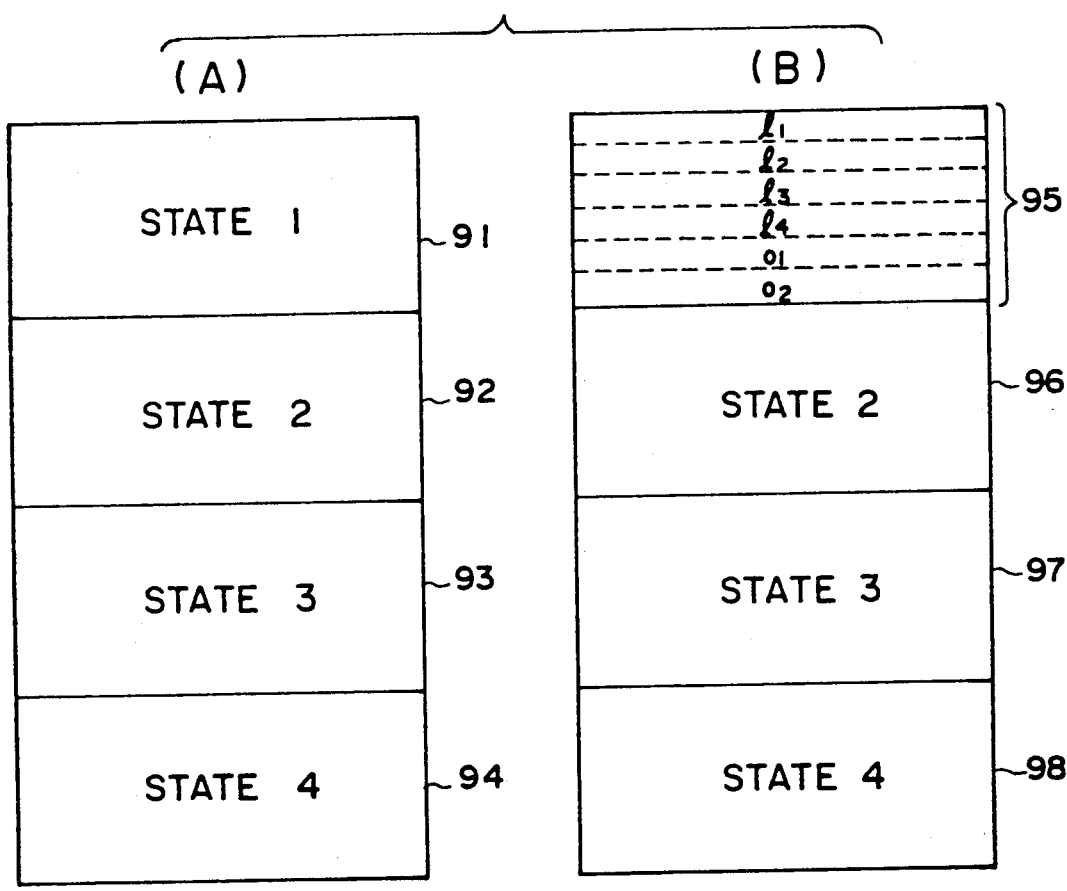
FIG. 10A and B are views illustrating data structures of memories shown in FIGS. 8 and 9.
Figure 11:
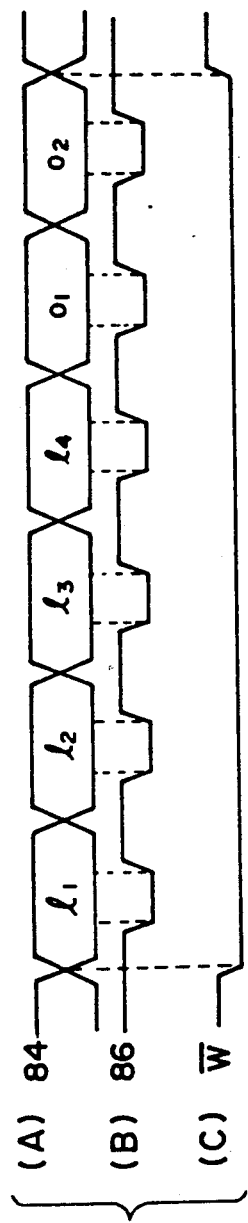
FIG. 11A, B and C are timing charts illustrating an operation of an essential part of the configuration shown in FIG. 9.

A description is given of a third embodiment of the present invention with reference to FIGS. 9 through 11. In FIG. 9, those parts which are the same as those shown in FIG. 8 are given the same reference numerals, and a description thereof is omitted. Referring to FIG. 9, a latch circuit consisting of inverting amplifiers 72 and 73 is connected to the control line 60 for each of the PLA intersecting points 15. The latch circuit is supplied with one bit of logic setting data 76 through a control line 75 and a semiconductor switching element 74. Although only an OR array 78 is illustrated in detail in FIG. 9, an AND array 77 is formed in the same manner as the OR array 78.

Semiconductor switching elements 74 are connected to related one of the control lines 75 for each of the product term lines $a_1$ and $a_2$ in each of the AND array 77 and the OR array 78. The control lines 75 are connected to output terminals of driver buffers $79_1$ and $79_2$.

On the other hand, each of the semiconductor switching elements 74 is ON/OFF controlled by related one of control lines $c_1$-$c_6$ extending from a decoder 80. Any one of the control lines $c_1$-$c_6$ is made active, and the semiconductor switching elements 74 in the row corresponding to the activated control line are simultaneously turned ON. Then logic setting data 76 is written into the latch circuits (inverting amplifiers 72 and 73) related to the row through the control lines 75 at the same time.

A RAM 81 is a memory which stores logic setting data 76 for a plurality of logical states. The logic setting data 76 for each of the states relates to all the PLA intersecting points 15 provided in the logic array part 21.

Either the output signal consisting of bits $y_1$ and $y_2$ or a 2-bit initial setting address 82 is selected by the address selector 67 on the basis of the select signal 68 supplied thereto, and is then input to an address control circuit 83. The address control circuit 83 sequentially outputs a memory address signal 84 related to a row of the PLA intersecting points 15 in response to the settled signal supplied from the address selector 67.

The memory address signal 84 sequentially designates the address of the RAM 81 whereby designated one of the plurality of sets of logic setting data 76 is output from the RAM 81. The above-mentioned operation is executable when the write enable signal $\overline{W}$ is in the enable state. The memory address signal 84 is input to the decoder 80, which is thereby made active. The activated decoder 80 sequentially makes the control lines $c_1$-$c_6$ one by one in synchronism with a gate signal 86 supplied from the address control circuit 83.

The third embodiment can provide four logical states based on two bits $y_1$ and $y_2$ of the output signal in the same manner as the second embodiment shown in FIG. 8. The RAM 81 has the logic setting data 76 for all the PLA intersecting points 15 provided in the logic array part 21 for each of the four logical states.

FIG. 10(B) is a storage format of the logic setting data 76 for the third embodiment. As an area 95 for the state 1 shown in FIG. 10(B), the area provided for every logical state is divided into sub-areas related to the input lines $1_1$ to $1_4$ and the output lines $O_1$, $O_2$.

A description is given of an operation of the third embodiment. At the time of starting operation, the address selector 67 selects the initial setting address 82 consisting of two bits in response to the select signal 68 supplied from a control circuit 85. Thereby, the address control circuit 83 accesses one of the areas 95-98 related to the states 1-4 shown in FIG. 10(B). In this case, the selected one of the areas 95-98 is accessed for each of the sub-areas related to the rows for the input lines $1_1$-$1_4$ and the output lines $O_1$ and $O_2$ of the logic array part 21. FIG. 11 is a timing chart illustrating the above-mentioned operation.

First, the write enable signal $\overline{W}$ supplied from the control circuit 85 is changed to L level as shown in FIG. 11(C), whereby the RAM 81 is set to the output enable state. Next, the address control circuit 83 outputs the memory address signal 84 which indicates an address on the RAM 81 to the area corresponding to the input line $1_1$ provided in the logic array part 21. Then the RAM 81 is accessed and the corresponding logic setting data 76 is output to the control lines 75 through the driver buffers $79_1$ and $79_2$.

The memory address signal 84 related to the input line $1_1$ is input to the decoder 80. Further, the gate signal 86 derived from the address control circuit 83 is output with a timing shown in FIG. 11(B). Thus, the decoder 80 makes the control line $c_1$ active with a timing when the gate signal 86 becomes low-active. The activated control line $c_1$ turns ON the semiconductor switching elements provided in the PLA intersecting points 15 related to the input line $1_1$ in the AND array 77.

The logic setting data 76 which is output from the RAM 81 through the above-mentioned operation is latched by the latch circuits (inverting amplifiers 72 and 73) coupled to the PLA intersecting points 15 for the input line $1_1$. Then the logical states of the PLA intersecting points 15 related to the input line $1_1$ are settled. Then, the address control circuit 83 sequentially outputs the address related to the input lines $1_2$-$1_4$ and the output lines $O_1$ and $O_2$ by the memory address signal 84 shown in FIG. 11(A) so that the above-mentioned operation is repeatedly executed. As a result, the logical states of all the PLA intersecting points 15 provided in the logic array part 21 are settled within the period when the write enable signal $\overline{W}$ shown in FIG. 11(C) is held active.

According to the third embodiment, as in the case of the second embodiment, the logic of the logic circuit formed by the logic array part 21 is dynamically changed on the basis of a change of the logic state defined by the outputs $y_1$ and $y_2$, and the logical state of the logic circuit is made transitional by its own output state.

The second embodiment shown in FIG. 8 differs from the third embodiment shown in FIG. 9 in the following. The second embodiment has the data latch circuit 61 having a capacity corresponding to all the PLA intersecting points 15 provided in the logic array part 21. On the other hand, the third embodiment has one latch circuit for each of the PLA intersecting points 15 in the logic array part 21.

Further, the data latch circuit 61 of the the second embodiment is provided outside of the logic array part 21. On the other hand, the data latch circuits each consisting of two inverting amplifiers 72 and 73 are provided within the logic array part 21.

The logical state of the logic array part 21 for the third embodiment is controlled on the basis of the output signal of the logic array part 21. Alternatively, it is possible to control the logical state on the basis of only the input signal thereof or both the input and output signals.

Figure 12:
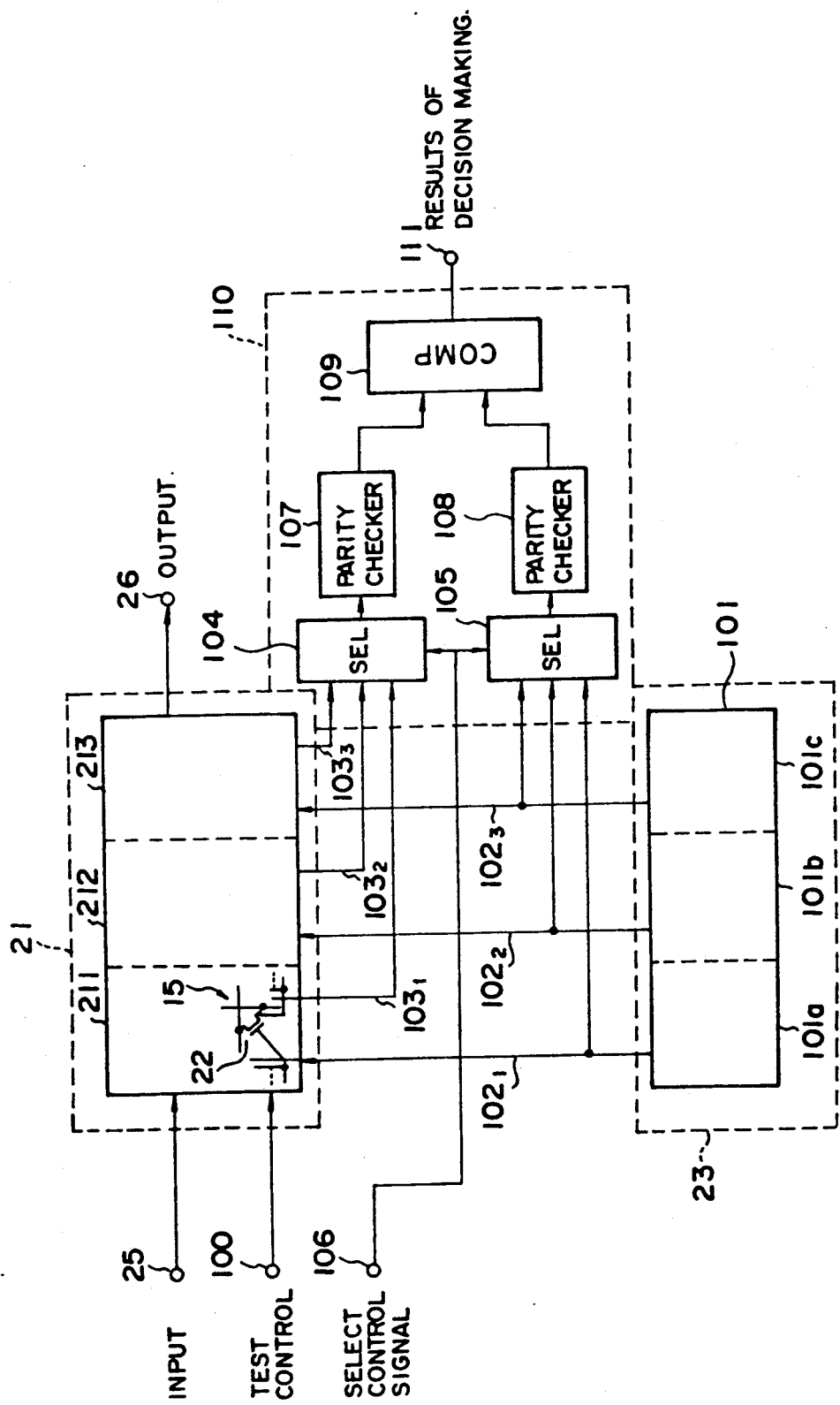
FIG. 12 is a block diagram of a fourth embodiment of the present invention.

According to the first to third embodiment of the present invention, the logical scale of PLA is extended by sequentially and selectively providing the logic array part 21 with logic setting data. In this case, it is important to check whether desired logic setting data has correctly been set in the logic array part 21. With reference to FIG. 12, a description is given of a fourth embodiment in which such a checking operation is executed. In FIG. 12, those parts which are the same as those shown in FIG. 4 are given the same reference numerals. It is noted that a circuit portion corresponding to the setting circuit 24 shown in FIG. 4 can be formed by the circuit used in any one of the first to third embodiments, and therefore it is omitted from FIG. 12.

Referring to FIG. 12, the logic array part 21 is divided into three blocks 211, 212 and 213. It is determined whether each of the first, second and third blocks 211, 212 and 213 can operate correctly by an operation which is to be executed during a time when a test control signal through an input terminal 100 is at a high level. An intersecting point information memory 101 corresponding to the storage circuit 23 shown in FIG. 4 has three divided memory areas 101a, 101b and 101c, which correspond to the first, second and third blocks 211, 212 and 213, respectively, all of which form the logic array part 21. The divided memory areas 101a, 101b and 101c separately supply the first, second and third blocks 211, 212 and 213 with logic setting data through control lines $102_1$, $102_2$ and $102_3$, respectively. The logic array part 21 supplies the output signal to the output terminal 26, and at the same time provides output lines $103_1$, $103_2$ and $103_3$ with intersecting point signals which are ON/OFF information on the semiconductor switching elements 22 provided at the PLA intersecting points 15.

The intersecting point signals supplied to the output lines $103_1$, $103_2$ and $103_3$ are supplied to an intersecting point signal selector 104. The logic setting data output to the control lines $102_1$-$102_3$ are supplied to an intersecting point information signal selector 105. The intersecting point signal selector 104 and the intersecting point information signal selector 105 are controlled by a selector control signal through an input terminal 106. The intersecting point signal selector 104 selects one of the intersecting point signals and then supplies the same to a parity checker 107. The intersecting point information signal selector 105 selects one of the logic setting data on the control lines $102_1$ to $102_3$ and then supplies a parity checker 108 with the selected logic setting data. A comparator 109 compares the result of parity check supplied from the parity checkers 107 and 108. When both the results coincide with each other, the comparator 109 supplies an output terminal 111 with a detection signal that indicates the block of concern can operate correctly. Adversely, when the results are different from each other, the comparator 109 supplies the output terminal 111 with a detection signal which indicates that the block of concern is defective. That is, a normality/defect detection circuit 110 for the blocks 211, 212 and 213 formed in the logic array part 21 is formed by the intersecting point signal selector 104, the intersecting point information signal selector 105, the parity checkers 107, 108 and the comparator 109.

Figure 13A:
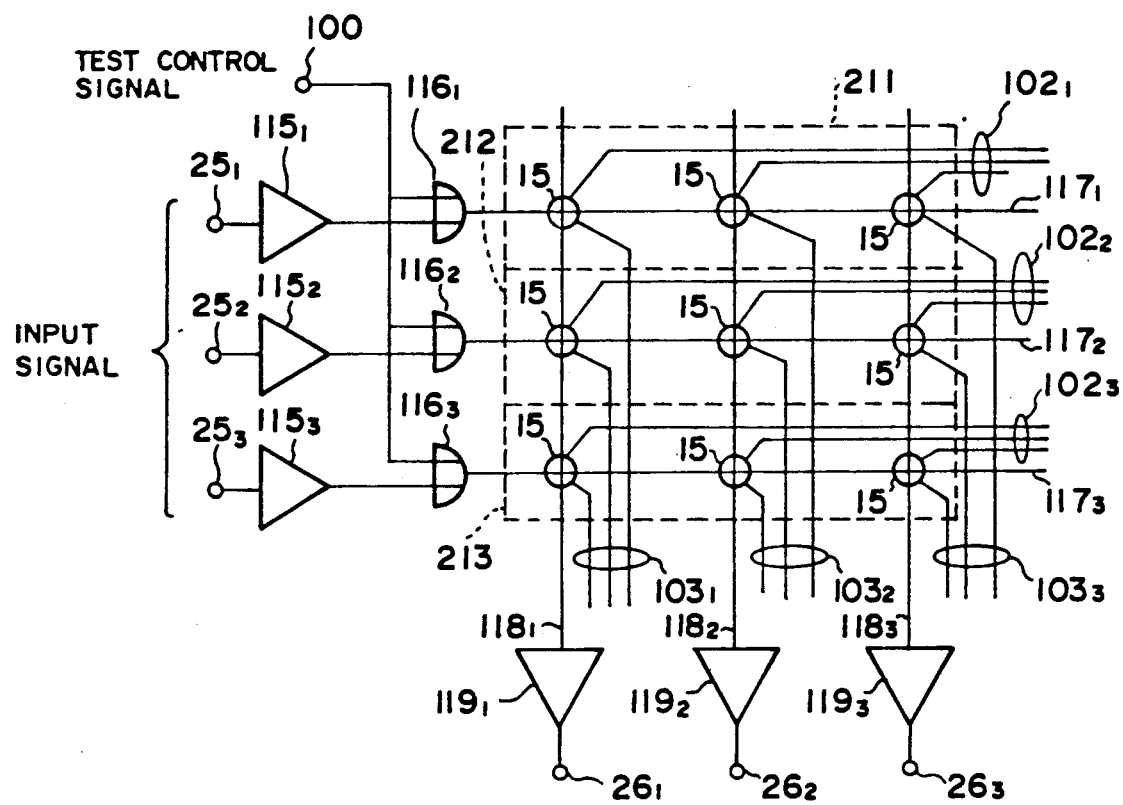
FIGS. 13A and 13B ar circuit diagrams of logic array parts shown in FIG. 9.
Figure 13B:
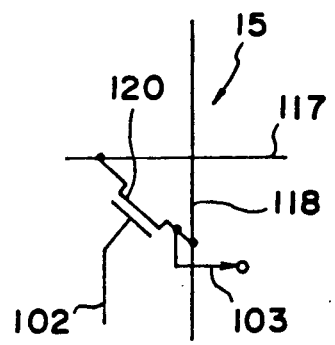

A description is given of the structural elements shown in FIG. 12 with reference to FIGS. 13A and 13B. FIG. 13A is a circuit diagram of the logic array part 21 shown in FIG. 12, and FIG. 13B is a circuit diagram of an essential part of the configuration shown in FIG. 13A. In FIGS. 13A and 13B, those parts which are the same as those shown in FIG. 12 are given the same reference numerals, and a description thereof is omitted. Referring to FIG. 13A, input signals applied to input terminals $25_1$-$25_3$ are supplied to OR circuits $116_1$-$116_3$ through input buffers $115_1$-$115_3$. The OR circuits $116_1$-$116_3$ execute an OR operation on the input signals and the test control signal supplied through the input terminal 100.

Output terminals of the OR circuits $116_1$-$116_3$ are connected to input lines $117_1$-$117_3$. Output lines $118_1$, $118_2$ and $118_3$ are arranged so as to be perpendicular to the input lines $117_1$, $117_2$ and $117_3$, and are connected to output terminals $26_1$, $26_2$ and $26_3$ through output buffers $119_1$, $119_2$ and $119_3$, respectively.

As shown in 13B, transistors 120 serving as semiconductor switching elements 22 are provided at the intersecting points of the input lines $117_1$-$117_3$ and the output lines $118_1$-$118_3$ (PLA intersecting points 15). Gates of the transistors 120 are connected to the control lines 102 ($102_1$-$102_3$), and drains or sources thereof are connected to the output lines 103 ($103_1$-$103_3$).

Figure 14:
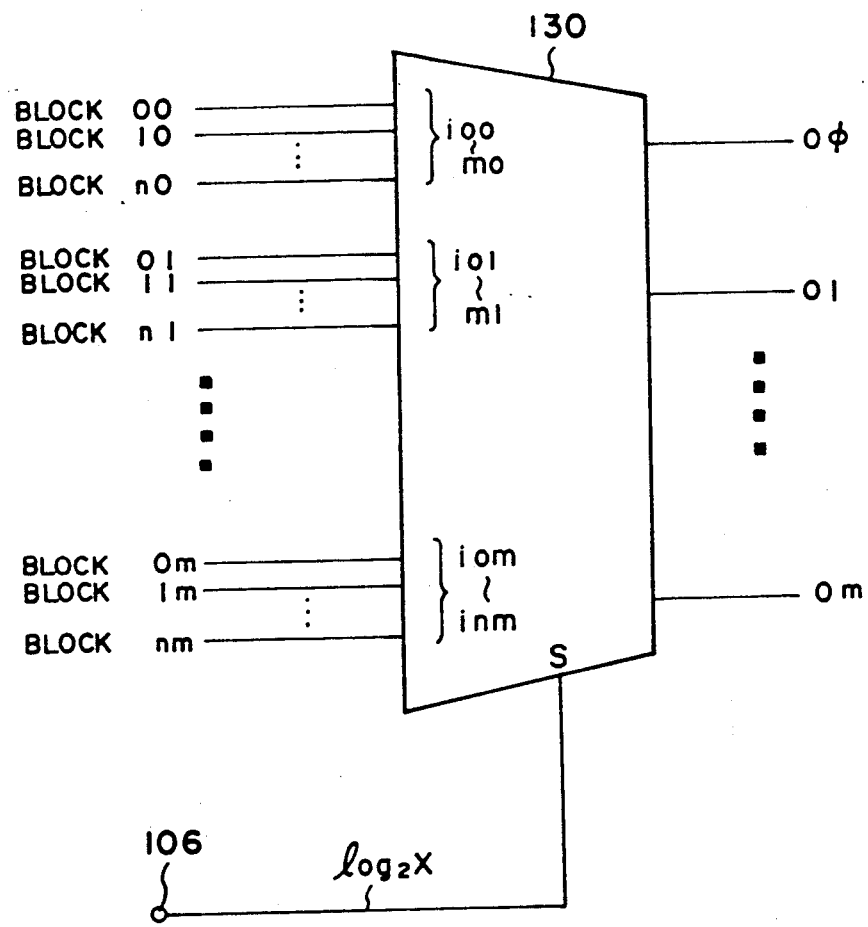
FIG. 14 is a block diagram of a selector shown in FIG. 12.

As shown in FIG. 14, each of the intersecting point signal selector 104 and the intersecting point information signal selector 105 is formed by a selector having (m+1) output terminals. In FIG. 14, n is a value obtained by subtracting 1 from the number of divided blocks (n=2 for the present embodiment), (m+1) is the number of bits of data, and x is a minimum of a power of 2 larger than n. The selector 130 selects the output signals $O_0$-$O_m$ from among inputs $ik_0$-$ik_m$ (k=0−n) on the basis of the select signal represented by $\log_2 x$.

Figure 15:
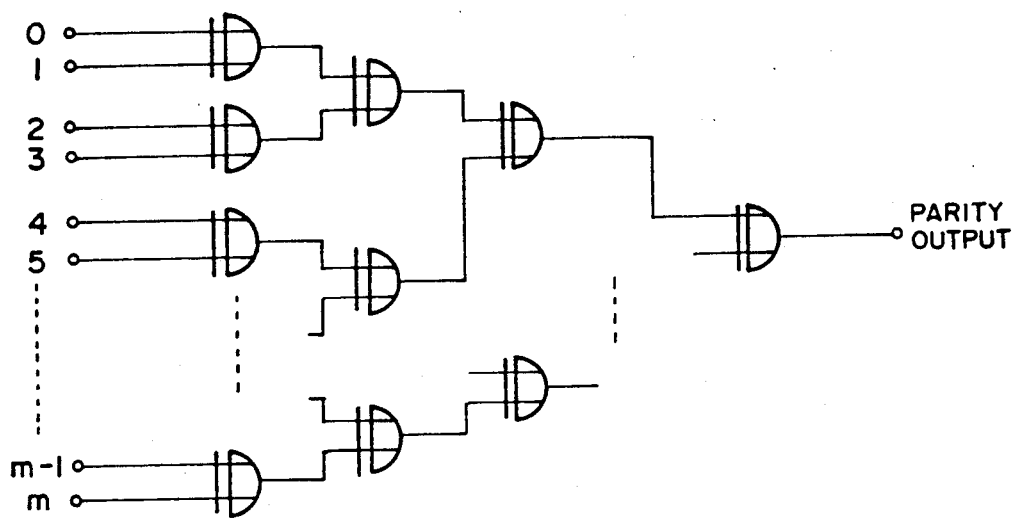
FIG. 15 is a circuit diagram of a parity checker shown in FIG. 12.

FIG. 15 illustrates a structure for each of the parity checkers 107 and 108 shown in FIG. 12. Each of the parity checkers 107 and 108 is made up of (m−1) exclusive-OR circuits, which carry out the parity check for the (m+1) bits supplied from the selectors 104 and 105.

A description is given of an operation of the fourth embodiment shown in FIGS. 12 to 15. The test control signal which is at H level is supplied to the logic array part 21 through the input terminal 100. Thus, the output signals of the OR circuits $116_1$-$116_3$ shown in FIG. 13A, that is, the signals on the input lines $117_1$-$117_3$ are all fixed to H level. Thereby, the semiconductor switching elements 22 (transistors 120) are turned ON which are supplied with logic setting data having a value of "1" from the divided memory areas 101a-101c through the control lines $102_1$-$102_3$.

The intersecting point signals supplied from the semiconductor switching elements 22 are supplied to the intersecting point signal selector 104. At the same time, the aforementioned logic setting data is supplied to the intersecting point information signal selector 105. The intersecting point signal selector 104 and the intersecting point information signal selector 105 are controlled by the selector control signal, and select the intersecting point signals related to one of the blocks 211-213 and the logic setting data related to corresponding one of the divided memory areas 101a–101c.

For example, when the intersecting point signal selector 104 selects the first block 211 of the logic array part 21, the intersecting point information signal selector 105 selects the logic setting data related to the first memory area 101a of the intersecting point information memory 101.

The signals output from the intersecting point signal selector 104 are supplied to the parity checker 107 and subjected to the parity check. The result of the parity check is based on the number of semiconductor switching elements 22 120) which are ON. The signals output from the intersecting point information signal selector 105 are supplied to the parity checker 108 and subjected to the parity check. The result of the parity check is based on the intersecting point information signal which turns the semiconductor switching elements 22 ON.

The comparator 109 compares the parity check results obtained by the parity checkers 107 and 108. In other words, the comparator 109 determines whether the number of semiconductor switching elements 22 (120) which are ON is equal to the number of semiconductor switching elements 22 (120) which are requested to be turned ON by the logic setting data. When both the numbers are different from each other, the logic array part 21 is determined to have a defect. In this case, the comparator output is supplied to the output terminal 111 as a defect detection signal. Thus, the PLA of the fourth embodiment has a self-diagnosis function.

Figure 16:
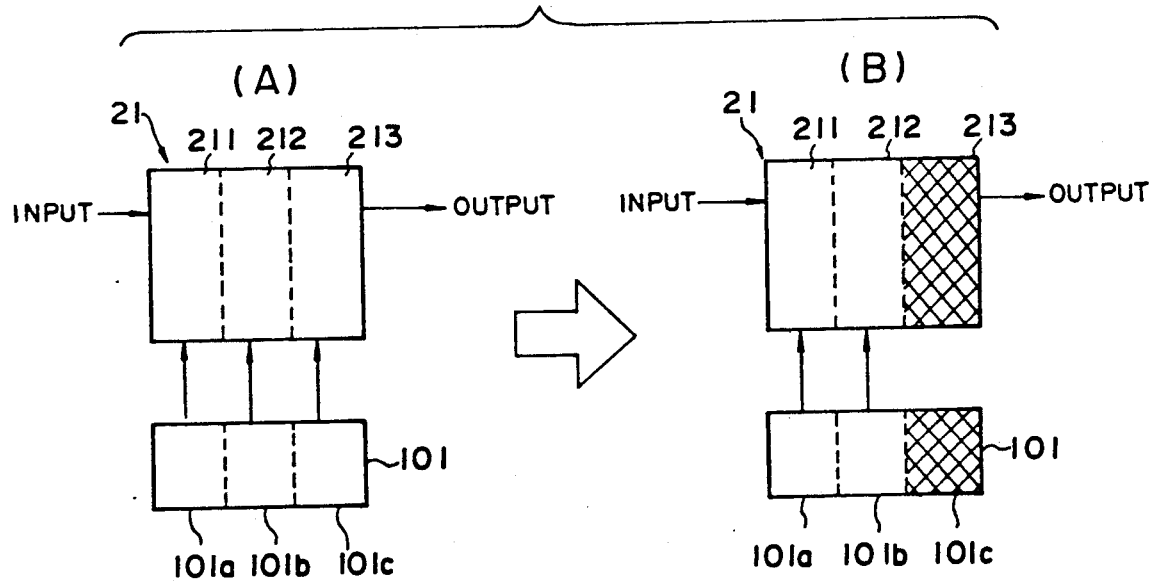
FIG. 16A and B are circuit diagrams illustrating an operation of the parity checker shown in FIG. 15.

FIG. 16 is a diagram illustrating a case where a defective block has been detected. As shown in FIG. 16(A), each of the intersecting point information memory 101 and the logic array part 21 is divided into three blocks. If the third block 213 is detected to be defective as shown in FIG. 16(B), the third memory area 101c corresponding to the third block 213 of the logic array part 21, and the defective third block 213 are inhibited from being used. Then related information to be set in the logic array part 21 is written into the first and second memory areas 101a and 101b of the intersecting point information memory 101. Thus, a logic circuit consisting of the first and second blocks 211 and 212 of the logic array part 21 is formed.

The above description relates to the case where the logic array part 21 or the intersecting point information memory 101 is partially defective. However, the fourth embodiment is not limited to the case. According to the fourth embodiment, it is possible to detect a defect of logic setting data. In each of the first to the third embodiment, a plurality of kinds (sets) of logic setting data are stored in the intersecting point information memory 101. Therefore, by sequentially carrying out the aforementioned defect detection procedure for each of the sets of logic setting data, plural detection results can be obtained.

When hardware of the logic array part 21 or the intersecting point information memory 101 is defective, all of the above-mentioned individual detection results indicate that there is a defect. On the other hand, when specific logic setting data among all the sets of logic setting data has an error, only the defect detection result for the specific logic setting data indicates that there is a defect. In this manner, the fourth embodiment can detect an error of logic setting data.

According to the present invention, a plurality of logic circuits related to a plurality of sets of logic setting data can be formed by a single logic array part. Thus, the logical scale of a single logic array part can equivalently be extended to a logical scale obtained by a plurality of logic arrays. Further, according to the present invention, different sets of logic setting data are selectively set in the logic array part one by one at the same time as the output signal of the logic array part is fed back to the input side thereof. Thus, the result of a complex logic operation obtained by cascading a plurality of logic circuits (logic arrays) can be obtained by a single logic array part which is provided with a plurality of sets of logic setting data.

Furthermore, according to the present invention, the structure of logic circuit formed by a single logic array part can be changed by sequentially selecting one of sets of logic setting data on the basis of the logical state of the input signal or the output signal with respect to the logic array part. Thus, a plurality of logic operations obtained by a plurality of logic circuits can be selected based on the input signal or the output signal with respect to the logic array part. As a result, a variety of logic operations can be achieved by a minimum hardware structure.

Moreover, according to the present invention, the logic array part is divided into a plurality of blocks and the memory area which stores logic setting data is divided into the same number of memory areas. The logic setting data read out from the plurality of memory areas are sequentially supplied to the corresponding divided blocks. Then, the output of the block being processed is compared with the logic setting data related to the corresponding memory area and it is determined whether there is a defect on the basis of the comparison result. Thus, it is possible to form a logic circuit by use of blocks which are not defective. As a result, the user copes with defects and uses PLA effectively and efficiently. In addition, it is possible to check whether logic setting data has been switched correctly.

The present invention is not limited to the aforementioned embodiments, and variations and modifications may be made without departing from the scope of the claimed invention.

We claim:

1. A programmable logic array with an extended logical scale provided with an input signal, comprising:
   logic array means including a logic circuit and a plurality of programmable logic array intersecting points, for carrying out a logic operation provided by the logic circuit on the input signal and for providing an output signal indicative of a result of the logic operation, said logic array means including a plurality of semiconductor switching elements provided at the plurality of programmable logic array intersecting points, the logic operation of the logic circuit being set by a plurality of sets of logic setting data supplied to said plurality of semiconductor switching elements;
   storage means for storing the plurality of sets of logic setting data; and
   setting means for selecting one of the plurality of sets of logic setting data stored in said storage means and for supplying said logic array means with the selected one of the plurality of sets of logic setting data,
   wherein said logic array means carries out the logic operation with respect to said input signal while the logic operation for said input signal is switched by said setting means.

2. A programmable logic array as claimed in claim 1, wherein said logic array means includes a plurality of divided blocks, and wherein said storage means includes a same quantity of a plurality of divided memory areas as a quantity of the plurality of divided blocks, said programmable logic array further comprising:

normality/defect detecting means for comparing one of the plurality of sets of logic setting data read out from one of said plurality of divided memory areas and a plurality of ON/OFF information on said plurality of semiconductor switching elements obtained by supplying said read-out logic setting data to a corresponding one of said divided blocks and for determining whether said programmable logic array operates correctly based on a comparison result.

3. A programmable logic array with an extended logical scale, comprising:

logic array means including a logic circuit and a plurality of programmable logic array intersecting points, for carrying out a logic operation provided by the logic circuit on the input signal and for providing an output signal indicative of a result of the logic operation, said logic array means including a plurality of semiconductor switching elements provided at the plurality of programmable logic array intersecting points, the logic operation of the logic circuit being set by a plurality of sets of logic setting data supplied to said plurality of semiconductor switching elements;

storage means for storing the plurality of sets of logic setting data;

selecting means for sequentially selecting one of the plurality of sets of logic setting data stored in said storage means and for supplying said logic array means with the selected one of the plurality of sets of logic setting data;

latch means for temporarily storing said result of the logic operation supplied from said logic circuit of the logic array means and for outputting at least one of a latched operation result to said logic array means as said input signal for the logic array means and said latched operation result as said output signal; and setting means for receiving said latched operation result, and for selecting one of the plurality of sets of logic setting data when said result of the logic operation is stored in said latch means, wherein the plurality of sets of logic setting data for said input signal is changed by said setting means and wherein said result of the logic operation derived from said logic array means is fed back thereto so that the logical scale of said programmable logic array can be extended.

4. A programmable logic array as claimed in claim 3, wherein said latch means includes means sequentially supplied with one of the plurality of sets of logic setting data, for generating a first latch signal obtained by latching said output signal supplied from said logic array means when a last one of the plurality of sets of logic setting data is supplied to said logic array means from said storage means through said selecting means and for feeding back to said logic array means a second latch signal obtained by latching said output signal each time one of the plurality of sets of logic array data except the last one of the plurality of sets of logic setting data is supplied to said logic array means from said storage means through said selecting means, said first latch signal being responsive to said output signal, and wherein said setting means includes input selecting means for selectively supplying said logic array means with an external input signal as said input signal to be supplied to said logic array means during a time when the first one of the plurality of sets of logic setting data is supplied to said logic array means from said storage means through said selecting means and for selectively supplying said logic array means with said second latch signal as said input signal to be supplied to said logic array means during a period when the second and following sets of logic setting data are supplied to said logic array means from said storage means.

5. A programmable logic array as claimed in claim 3, wherein each of the plurality of sets of logic setting data is composed of m bits, and wherein said storage means includes a plurality of registers each storing a corresponding one of the plurality of sets of logic setting data, and said selecting means includes m selectors supplied with a related bits of each of the plurality of sets of logic setting data stored in the plurality of registers.

6. A programmable logic array as claimed in claim 3, wherein said programmable logic array is provided with a control signal from an external device, wherein said programmable logic array includes an output terminal, and wherein said latch means includes:

first latch means supplied with the output signal of said logic array means and the control signal supplied from the external device, for latching the output signal of said logic array means when a level of said control signal changes at a same time as a last one of the plurality of sets of logic setting data is supplied to said logic array means and for outputting a first latched output signal to the output terminal; and second latch means supplied with the output signal of said logic array means and said control signal, for latching the output signal of said logic array means each time one of the plurality of sets of logic setting data except the last one of the plurality of sets of logic setting data is supplied to said logic array means from said storage means and for feeding back a second latched output signal to said input selecting means.

7. A programmable logic array as claimed in claim 6, wherein said input selecting means includes a selector which is supplied with said input signal and the second latched output signal of said second latch means and which selects at least one of said input signal and the second latched output signal on the basis of said control signal.

8. A programmable logic array as claimed in claim 3, wherein said logic array means includes a quantity of a plurality of divided blocks, and wherein said storage means includes a same quantity of divided memory areas, said programmable logic array further comprising:

normality/defect detecting means for comparing one of the plurality of sets of logic setting data read out from one of said plurality of divided memory areas and a plurality of ON/OFF information on said plurality of semiconductor switching elements obtained by supplying said read-out one of the plurality of sets of logic setting data to a corresponding one of said divided blocks of said logic array means and for determining whether said programmable logic array operates correctly based on a comparison result.

9. A programmable logic array as claimed in claim 3, wherein said logic array means includes a plurality of input buffers provided for a plurality of input lines through which said input signal is input and OR circuit means connected between said plurality of input buffers and said plurality of input lines, for carrying out an OR operation on said input signal supplied through said input buffers and a test control signal supplied from an external device.

10. A programmable logic array as claimed in claim 3, wherein each of said plurality of semiconductor switching elements includes a transistor including a gate, a source and a drain, and wherein said gate is supplied with a corresponding bit of said plurality of logic setting data, and said plurality of ON/OFF information on said plurality of semiconductor switching elements is drawn from said drain or source.

11. A programmable logic array as claimed in claim 8, wherein said normality/defect detecting means includes:
   an intersecting point signal selector coupled to said logic array means, which selects one of said plurality of divided blocks formed in said logic array means and outputs said plurality of ON/OFF information on said plurality of semiconductor switching elements related to the selected one of said plurality of divided blocks;
   an intersecting point information signal selector coupled to said storage means, which selects one of said plurality of divided memory areas and outputs said plurality of logic setting data stored in the selected one of said plurality of divided memory areas;
   a first parity checker coupled to said intersecting point information signal selector, which carries out a parity check for the plurality of ON/OFF information supplied from said intersecting point signal selector and outputs a first check result;
   a second parity checker coupled to said intersecting point information signal selector, which carries out a parity check for the plurality of logic setting data supplied from said intersecting point information signal selector and outputs a second check result; and
   a comparator coupled to said first and second parity checkers, which compares the first and second check results supplied from said first and second parity checkers to determine whether the first and second check results are identical to each other.

12. A programmable logical array as claimed in claim 3, wherein each of said first and second parity checkers includes exclusive-OR circuits coupled to said intersecting point signal selector and said intersecting point information signal selector, respectively, for determining whether a plurality of bits included in the plurality of ON/OFF information and the plurality of logic setting data, respectively, are identical to each other.

13. A programmable logic array as claimed in claim 11, wherein said programmable logic array is provided with a selector control signal supplied from an external device,
wherein each of said intersecting point signal selector and said intersecting point information signal selector includes a selector,
wherein said selector related to said intersecting point signal selector is simultaneously supplied with said plurality of sets of logic setting data composed of (m+1) bits (m is an integer) supplied from each of said plurality of divided memory areas, and selects (m+1) bits related to one of said plurality of divided memory areas on the basis of a selector control signal supplied from an external device, and
wherein said selector related to said intersecting point information signal selector is simultaneously supplied with said plurality of sets of logic setting data composed of (m+1) bits supplied from each of said plurality of divided blocks and selects (m+1) bits related to one of said plurality of divided blocks on the basis of said selector control signal.

14. A programmable logic array with an extended logical scale provided with an input signal, comprising:
   logic array means including a logic circuit, a plurality of programmable logic array intersecting points, a plurality of input lines, and a plurality of output lines, for carrying out a logic operation provided by the logic circuit on the input signal and for providing an output signal indicative of a result of the logic operation, said logic array means including a plurality of semiconductor switching elements provided at the plurality of programmable logic array intersecting points where the plurality of input lines through which said input signal is input intersect with the plurality of output lines through which said output signal is output, the logic operation of the logic circuit being changed by a plurality of sets of logic setting data supplied to said plurality of semiconductor switching elements;
   storage means for storing a plurality of sets of logic setting data; and
   control means for supplying, as an address signal, said storage means with at least one of said input signal and said output signal of said logic array means so that one of the plurality of sets of logic setting data stored in said storage means is supplied to said logic array means by using a value of said address signal corresponding to said supplied one of said input and output signals,
   wherein said plurality of logic setting data is determined by the previous input signal and the result of the logic operation, so that the logical scale of said programmable logic array can be extended.

15. A programmable logic array as claimed in claim 14,
   wherein said programmable logic array is supplied with an initial setting address from an external device,
   wherein:
   said storage means includes a random access memory, and
   said control means includes:
      an address selector coupled to said storage means, provided with at least one of said output and input signals of said logic array means and the initial setting address supplied from the external device, and
      second control means for letting said address selector select said initial setting address at a time of starting up said logic array means and for letting said address selector select at least one of said output and input signals of said logic array means after the output signal related to said initial setting address is derived from said logic array means.

16. A programmable logic array as claimed in claim 14, further comprising:
data latch means for latching a selected one of the plurality of sets of logic setting data at one time from said storage means and for supplying said plurality of semiconductor switching elements provided at the plurality of programmable logic array intersecting points of said logic array means with said latched selected one of the plurality of sets of logic setting data.

17. A programmable logic array as claimed in claim 16,
wherein said programmable logic array is provided with an initial setting address supplied from an external device,
wherein said control means includes:
an address selector connected to said storage means, supplied with at least one of said output and input signals of said logic array means and the initial setting address supplied from the external device;
second control means for controlling said address selector to select said initial setting address at a time of starting up said logic array means and for controlling said address selector to select at least one of said output and input signals after the output signal related to said initial setting address is derived from said logic array means; and
address control means supplied with the output signal of said address selector, for supplying, as an address signal, said storage means with said supplied output signal of said address selector.

18. A programmable logic array as claimed in claim 17,
wherein each of said plurality of semiconductor switching elements includes an input side,
wherein said logic array means includes:
latch means, provided on the input side of each of said plurality of semiconductor switching elements provided at each of said plurality of programmable logic array intersecting points, for latching a corresponding bit of said selected one of the plurality of sets of logic setting data;
switching element means provided between said storage means and each of said latch means, for controlling a corresponding one of said latch means by turning ON or OFF; and
decoder means supplied with said address signal and a gate signal derived from said address control means, for simultaneously turning ON said switching element means related to a same row of said plurality of programmable logic array intersecting points and for sequentially turning ON said switching element means for every row.

19. A programmable logic array as claimed in claim 17, wherein said storage means includes a random access memory which stores said plurality of sets of logic setting data, each of which is related to al the plurality of programmable logic array intersecting points and is stored in a respective memory area formed in said random access memory, and wherein each of the plurality of sets of logic setting data stored in the corresponding memory area is divided into a plurality of blocks of data, each corresponding to each of said input and output lines in said logic array means.

20. A programmable logic array as claimed in claim 14, wherein said logic array means includes a plurality of divided blocks, and said storage means includes a same number of divided memory areas, and wherein said programmable logic array further comprises normality/defect detecting means for comparing said plurality of logic setting data read out from one of said plurality of divided memory areas and a plurality of ON/OFF information on said plurality of semiconductor switching elements obtained by supplying said read-out plurality of logic setting data to a corresponding one of said divided blocks and for determining whether said programmable logic array operates correctly based on a comparison result.

21. A programmable logic array as claimed in claim 20,
wherein said programmable logic array is provided with a test control signal supplied from an external device,
wherein said logic array means is coupled to a plurality of input buffers, and
wherein said logic array means includes OR circuit means, connected between the plurality of input buffers and the plurality of input lines, for carrying out an OR operation on said input signal supplied through said plurality of input buffers and the test control signal supplied from the external device.

22. A programmable logic array as claimed in claim 20, wherein each of said plurality of semiconductor switching elements includes a transistor including a gate, a source and a drain, and wherein said gate is supplied with a corresponding bit of said plurality of logic setting data, and said plurality of ON/OFF information on each of said plurality of semiconductor switching elements is drawn from said drain or source.

23. A programmable logic array as claimed in claim 20, wherein said normality/defect detecting means includes:
an intersecting point signal selector coupled to said logic array means, which selects one of said plurality of divided blocks formed in said logic array means and outputs said plurality of ON/OFF information on said plurality of semiconductor switching elements related to the selected one of the plurality of divided blocks;
an intersecting point information signal selector coupled to said storage means, which selects one of said plurality of divided memory areas and outputs said plurality of logic setting data stored in the selected one of the plurality of divided memory areas;
a first parity checker coupled to said intersecting point signal selector, which carries out a parity check for the plurality of ON/OFF information supplied from said intersecting point signal selector and outputs a first check result;
a second parity checker coupled to said intersecting point information signal selector, which carries out a parity check for the plurality of logic setting data supplied from said intersecting point information signal selector and outputs a second check result; and
a comparator coupled to said first and second parity checkers, which compares the first and second check results supplied from said first and second parity checkers to determine whether the first and second check results are identical to each other.

24. A programmable logic array as claimed in claim 20, wherein each of said first and second parity checkers includes exclusive-OR circuits coupled to said intersecting point signal selector and said intersecting point information signal selector, respectively, for determining whether a plurality of bits included in the plurality of ON/OFF information and the plurality of logic setting data, respectively, are identical to each other.

25. A programmable logic array as claimed in claim 20,
wherein said programmable logic array is provided with a selector control signal from an external device,
wherein each of said intersecting point signal selector and said intersecting point information signal selector includes a selector,
wherein said selector of said intersecting point signal selector is simultaneously supplied with said plurality of sets of logic setting data composed of (m+1) bits (m is an integer) supplied from each of said plurality of divided memory areas, and selects (m+1) bits related to one of said plurality of divided memory areas based on the selector control signal supplied from the external device, and
wherein said selector of said intersecting point information signal selector is simultaneously supplied with said plurality of sets of logic setting data composed of (m+1) bits supplied from each of said plurality of divided blocks, and selects (m+1) bits related to one of said plurality of divided blocks based on said selector control signal.

26. A programmable logic array with an extended logical scale supplied with an input signal, comprising:
a logic array which provides a logic operation on a selected signal, based on at least one of a plurality of sets of data, to generate an output signal;
a first selector connected to said logic array, for selecting between the input signal and the output signal to generate the selected signal;
a memory connected to said logic array, for storing the plurality of sets of data, and for providing a selected one of the plurality of sets of data to said logic array; and
a second selector connected to said memory, which is operable to designate the selected one of the plurality of sets of data.

27. A method of using a programmable logic array with an extended logical scale including a memory and a logic array, comprising the steps of:
(a) loading a plurality of sets of data into the memory;
(b) selecting at least one of the plurality of sets of data in the memory;
(c) supplying the selected at least one of the plurality of sets of data to the logic array from the memory;
(d) selecting between an output signal from the logic array and an input signal to generate a selected signal; and
(e) supplying the logic array with the selected signal to produce the output signal which is responsive to the selected signal and the selected at least one of the plurality of sets of data.

28. A normality/defect detector of a programmable logic array with an extended logical scale including a memory, comprising:
a first parity checker connected to the programmable logic array, for receiving a set of data supplied from the programmable logic array and for determining a first parity of the particular set of data;
a second parity checker connected to the memory, for receiving a corresponding set of data stored in the memory and for determining a second parity of the corresponding set of data; and
a comparator connected to said first and second parity checkers, for receiving the first and second parities and for determining whether the first and second parities are identical.

29. A method of using a normality/defect detector of a programmable logic array with an extended logical scale including a memory, comprising the steps of:
(a) receiving a set of data from the programmable logic array;
(b) receiving a corresponding set of data from the memory;
(c) determining a first parity of the set of data;
(d) determining a second parity of the corresponding set of data; and
(e) comparing the first and second parities to determine whether the first and second parities are identical.

* * * * *

UNITED STATES PATENT AND TRADEMARK OFFICE
CERTIFICATE OF CORRECTION

Page 1 of 2

PATENT NO. : 5,132,570

DATED : July 21, 1992

INVENTOR(S) : Shutou et al.

It is certified that error appears in the above-identified patent and that said Letters Patent is hereby corrected as shown below:

On the Title page, item

[57] IN THE ABSTRACT:

Line 13, change "dated" to --data--.

Column 1, line 21, change "operation"

to --operations--.

Column 3, line 25, change "operation"

to --operations--;

Column 3, line 61, change "use" to --user--.

UNITED STATES PATENT AND TRADEMARK OFFICE
CERTIFICATE OF CORRECTION

PATENT NO.    : 5,132,570
DATED         : July 21, 1992
INVENTOR(S)   : Shutou et al.

It is certified that error appears in the above-identified patent and that said Letters Patent is hereby corrected as shown below:

Column 10, line 45, change "12-14" to

--$1_2 - 1_4$--.

Column 13, line 13, change "120)" to

--(120)--.

Column 16, line 23, change "bits"

to --bit--;
Column 17, line 2, delete "of said logic array means".

Signed and Sealed this

Seventeenth Day of August, 1993

Attest:

BRUCE LEHMAN

Attesting Officer          Commissioner of Patents and Trademarks